(12) United States Patent
Watanabe et al.

(10) Patent No.: US 9,368,351 B2
(45) Date of Patent: Jun. 14, 2016

(54) SEMICONDUCTOR DEVICE AND METHOD FOR MANUFACTURING SAME

(71) Applicant: ROHM CO., LTD., Kyoto-shi, Kyoto (JP)

(72) Inventors: Heiji Watanabe, Suita (JP); Takayoshi Shimura, Suita (JP); Takuji Hosoi, Suita (JP); Shuhei Mitani, Kyoto (JP); Yuki Nakano, Kyoto (JP); Ryota Nakamura, Kyoto (JP); Takashi Nakamura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/380,522

(22) PCT Filed: Feb. 22, 2013

(86) PCT No.: PCT/JP2013/054581
§ 371 (c)(1),
(2) Date: Aug. 22, 2014

(87) PCT Pub. No.: WO2013/125696
PCT Pub. Date: Aug. 29, 2013

(65) Prior Publication Data
US 2015/0034971 A1    Feb. 5, 2015

(30) Foreign Application Priority Data

Feb. 24, 2012 (JP) ................. 2012-039059

(51) Int. Cl.
*H01L 29/66* (2006.01)
*H01L 21/04* (2006.01)
(Continued)

(52) U.S. Cl.
CPC .......... *H01L 21/049* (2013.01); *H01L 21/3105* (2013.01); *H01L 21/31111* (2013.01); *H01L 21/31116* (2013.01); *H01L 29/1608* (2013.01); *H01L 29/66712* (2013.01);
(Continued)

(58) Field of Classification Search
CPC ............... H01L 21/8234; H01L 21/823462; H01L 29/4908; H01L 29/66545
See application file for complete search history.

(56) References Cited

U.S. PATENT DOCUMENTS 6,117,751 A * 9/2000 Schoerner ............. H01L 21/049
257/E21.063
2006/0163630 A1   7/2006 Callegari et al.
(Continued)

FOREIGN PATENT DOCUMENTS

| | | |
|---|---|---|
| JP | 07-130809 | 5/1995 |
| JP | 09-055504 | 2/1997 |

(Continued)

*Primary Examiner* — Jae Lee
(74) *Attorney, Agent, or Firm* — Hamre, Schumann, Mueller & Larson, P.C.

(57) ABSTRACT

[Problem] To provide an SiC semiconductor device, with which stabilization of high-temperature operation can be achieved by decreasing mobile ions in a gate insulating film, and a method for manufacturing the SiC semiconductor device.

[Solution Means] A semiconductor device 1 has an MIS structure including an SiC epitaxial layer 3, a gate insulating film 9 and a gate electrode 10 formed on the gate insulating film 9. A gate insulating film 9 includes a silicon oxide film in contact with the SiC epitaxial layer 3. In the MIS structure, an area density $Q_M$ of positive mobile ions in the gate insulating film 9 is made no more than $1 \times 10^{12}$ cm$^{-2}$.

6 Claims, 13 Drawing Sheets

(51) Int. Cl.
  *H01L 29/16* (2006.01)
  *H01L 29/78* (2006.01)
  *H01L 21/3105* (2006.01)
  *H01L 21/311* (2006.01)
  *H01L 29/51* (2006.01)

(52) U.S. Cl.
  CPC ......... *H01L 29/66734* (2013.01); *H01L 29/78* (2013.01); *H01L 29/7802* (2013.01); *H01L 29/7813* (2013.01); *H01L 29/513* (2013.01)

(56) References Cited

U.S. PATENT DOCUMENTS

| | | |
|---|---|---|
| 2007/0243722 A1 | 10/2007 | Nakamura et al. |
| 2010/0015790 A1 | 1/2010 | Callegari et al. |
| 2011/0169141 A1* | 7/2011 | Shepard, Jr. ...... H01L 21/02164 257/640 |
| 2011/0284871 A1 | 11/2011 | Harada et al. |
| 2012/0139054 A1* | 6/2012 | Yin ................... H01L 21/28114 257/369 |

FOREIGN PATENT DOCUMENTS

| | | |
|---|---|---|
| JP | 2001-244260 | 9/2001 |
| JP | 2002-289612 | 10/2002 |
| JP | 2007-053227 | 3/2007 |
| JP | 2007-287992 A | 11/2007 |
| JP | 2008-530769 | 8/2008 |
| JP | 2009-016530 | 1/2009 |
| JP | 2011-243770 | 12/2011 |

* cited by examiner $Q_M = C_{max} \times \Delta V_{FB}$
$= C_{max} \times |V_{FB}(NBTS) - V_{FB}(PBTS)|$

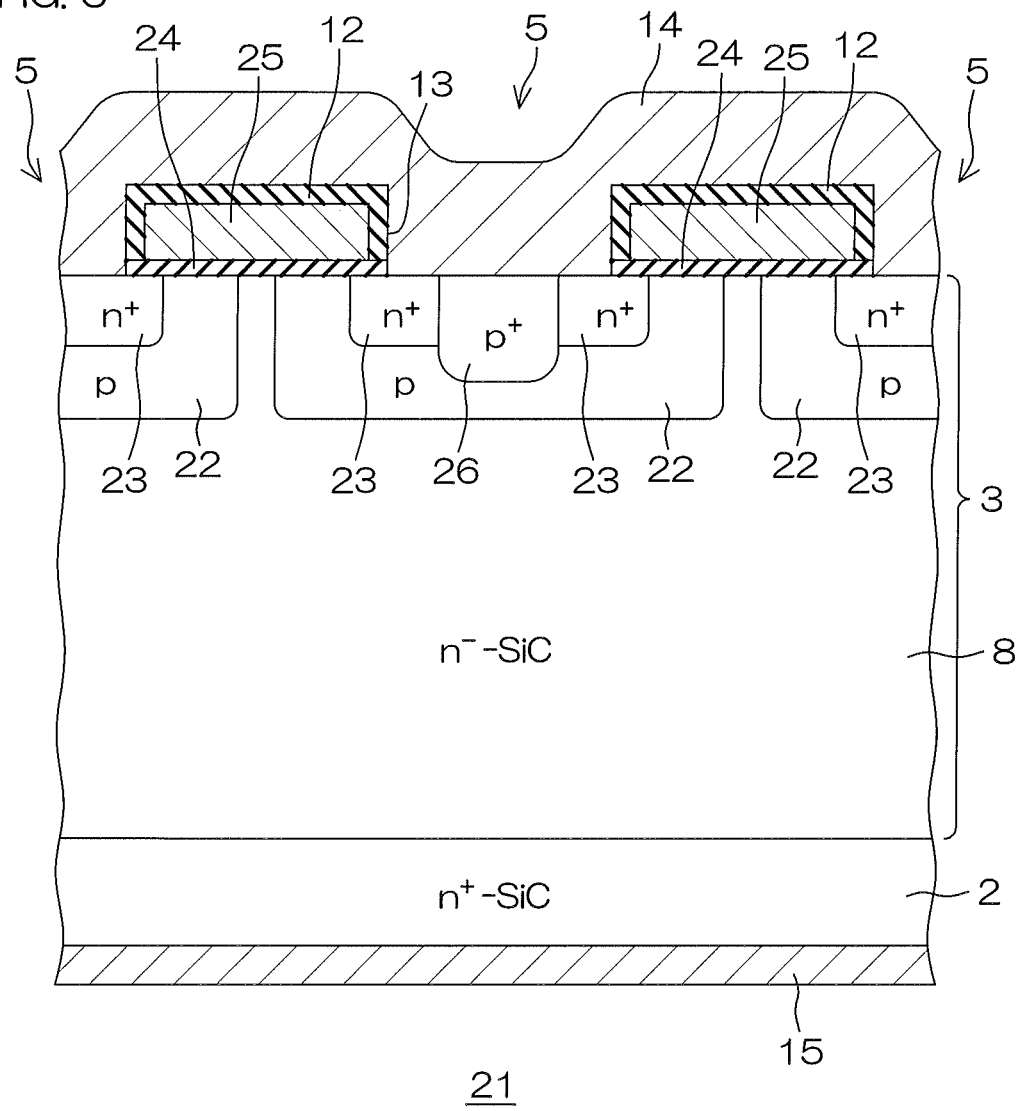

1. PBTS (+10V, 2min., 200°C)

2. Etching of oxide film
(HF etching)

3. Deposition of gate electrode

1. NBTS (-10V, 2min., 200°C)

2. Etching of oxide film
(HF etching)

3. Deposition of gate electrode

SEMICONDUCTOR DEVICE AND METHOD FOR MANUFACTURING SAME

FIELD OF THE ART

The present invention relates to an SiC semiconductor device having an MIS structure and a method for manufacturing the same.

BACKGROUND ART

SiC (silicon carbide) excels over Si (silicon) in dielectric breakdown resistance, heat conductivity, etc. SiC is thus noted as a semiconductor favorable for application in inverters of hybrid vehicles, etc. Specifically, a MISFET (metal insulator semiconductor field effect transistor) using SiC is anticipated for use as a high-voltage device favorable for inverters of hybrid vehicles, etc.

As an example of a MISFET using SiC, Patent Document 1 discloses an SiC semiconductor device that includes an n type SiC substrate, an n type drift layer formed on the SiC substrate, a p type well region formed in the drift layer, an n type source region formed in the p type well region, a gate insulating film formed on a front surface of the drift layer, and a gate electrode formed on the gate insulating film.

PRIOR ART DOCUMENT

Patent Document

Patent Document 1: Japanese Patent Application Publication No. 2009-16530

SUMMARY OF THE INVENTION

Problems to be Solved by the Invention

A silicon oxide film formed by thermal oxidation of SiC has a problem in that a large hysteresis occurs when an SiC-MISFET is put in operation at a high temperature. It is consequently predicted that the device characteristics vary easily. This problem is considered to be caused by the presence of mobile ions in the silicon oxide film.

When mobile ions are present in the insulating film, shifting of the threshold voltage of a transistor occurs. This is not preferable in terms of stable operation because the transistor may become normally on even though it is supposed to be normally off, etc.

An object of the present invention is to provide an SiC semiconductor device, with which stabilization of high-temperature operation can be achieved by decreasing mobile ions in a gate insulating film, and a method for manufacturing the SiC semiconductor device.

Means for Solving the Problems

The present invention provides a semiconductor device having an MIS structure including a semiconductor layer made of SiC, a gate insulating film in turn including a silicon oxide film in contact with the semiconductor layer, and a gate electrode formed on the gate insulating film and where an area density $Q_M$ of positive mobile ions in the gate insulating film is no more than $1\times10^{12}$ cm$^{-2}$ (Aspect 1).

With this arrangement, the area density $Q_M$ of positive mobile ions in the gate insulating film is no more than $1\times10^{12}$ cm$^{-2}$ and therefore the hysteresis of the MIS structure when made to operate at a high temperature can be suppressed to be small. Consequently, high-temperature operation of the semiconductor device can be stabilized. In particular, a device, such as an SiC semiconductor device, that is used as a high-voltage power device is often used in a state of high temperature due to self-heating, etc., and the effect due to the area density $Q_M$ of positive mobile ions being no more than $1\times10^{12}$ cm$^{-2}$ is thus extremely large. Although the lower the area density $Q_M$ of positive mobile ions, the more preferable, in consideration of reduced cost (measurement limit), etc., no less than $1\times10^{10}$ cm$^{-2}$ is a realistic level.

The area density $Q_M$ of positive mobile ions may, for example, be calculated by multiplying a maximum capacitance $C_{max}$ in C-V curves, obtained by performing bias temperature stress tests on the MIS structure, by a flat band voltage shift $\Delta V_{FB}$ ($C_{max}\times\Delta V_{FB}$).

The maximum capacitance $C_{max}$ is: (dielectric constant $\in$ of the gate insulating film•area $S_G$ of the gate insulating film)/thickness $d_G$ of the gate insulating film ($C_{max}=\in\cdot S_G/d_G$). $\Delta V_{FB}$ is the absolute value of the difference between a flat band voltage $V_{FB}$ (NBTS) of the C-V curve obtained by a negative bias temperature stress (NBTS) and a flat band voltage $V_{FB}$ (PBTS) of the C-V curve obtained by a positive bias temperature stress (PBTS) ($\Delta V_{FB}=|V_{FB}$ (NBTS)$-V_{FB}$ (PBTS)$|$).

The area density $Q_M$ of positive mobile ions can thus be expressed as: $Q_M=(\in\cdot S_G/d_G)\times|V_{FB}$ (NBTS)$-V_{FB}$ (PBTS)$|$.

The positive mobile ions in the gate insulating film become a problem only when operation at a considerably high temperature is performed and was therefore not well-known conventionally. This problem and its solution were found for the first time in the present invention.

By this invention, an electric field intensity $E_G$ due to the positive mobile ions in the gate insulating film can be made no more than 5 MV/cm. The electric field intensity $E_G$ is preferably 2 MV/cm.

The gate insulating film may be made of a single layer film of the silicon oxide film (Aspect 3) or may be made of a laminated film including a lower film made of the silicon oxide and an upper film formed on the lower film and made of an insulating material differing from silicon oxide (Aspect 4).

In the case where the gate insulating film is a laminated film, the upper film is preferably made of at least one type of substance selected from the group consisting of aluminum oxide, aluminum oxynitride, and hafnium oxide (Aspect 5).

Also, the gate insulating film may have a thickness of 100 Å to 1000 Å (Aspect 6).

Also, the MIS structure may include a trench gate type structure (Aspect 7) or may include a planar gate structure (Aspect 8).

The semiconductor device according to the present invention can be manufactured by a method for manufacturing a semiconductor device that includes a step of forming a gate insulating film, which includes a silicon oxide film formed by thermal oxidation of a semiconductor layer made of SiC and with which the area density $Q_M$ of positive mobile ions in its interior is no more than $1\times10^{12}$ cm$^{-2}$, and a step of forming an MIS structure by forming a gate electrode on the gate insulating film (Aspect 9).

More preferably, the step of forming the gate insulating film includes a step of forming a temporary electrode on a front surface of the silicon oxide film, a step of applying a negative bias to the temporary electrode to attract the positive mobile ions in the silicon oxide film toward a front surface portion of the silicon oxide film, a step of removing the temporary electrode after attracting the positive mobile ions, and a step of etching the front surface portion of the silicon oxide film after removing the temporary electrode (Aspect 10).

With this method, after attracting the positive mobile ions to the front surface portion of the silicon oxide film, the front surface portion (the portion in which the positive mobile ions are gathered) is eliminated by etching and the positive mobile ions in the front surface portion can thereby be removed. The absolute amount of the positive mobile ions in the silicon oxide film can thereby be decreased and the area density $Q_M$ of positive mobile ions contained in the entire gate insulating film can be made no more than $1 \times 10^{12}$ cm$^{-2}$.

If the step of removing the temporary electrode is a step of dry etching the temporary electrode, the step of etching the front surface portion of the silicon oxide film preferably includes a step of dry etching the silicon oxide film by the dry etching for removing the temporary electrode (Aspect 11).

With this method, the front surface portion of the silicon oxide film can be eliminated continuously in succession to the removal of the temporary electrode and the manufacturing process can thereby be simplified.

Also, the step of etching the front surface portion of the silicon oxide film may include a step of wet etching the silicon oxide film (Aspect 12).

That is, the front surface portion of the silicon oxide film may be etched by either dry etching or wet etching, or the two types of etching may be used in combination. When combined use is made, the portion of the silicon oxide film in which the positive mobile ions are gathered can be removed reliably, and the state of the front surface of the silicon oxide film that has been damaged by the dry etching can be improved by the wet etching.

The step of forming the gate electrode may be a step of forming the gate electrode directly on the silicon oxide film after the etching of the silicon oxide film (Aspect 13).

By this method, the gate insulating film can be formed as a single layer film of the silicon oxide film.

On the other hand, the step of forming the gate insulating film may include a step of further forming an upper film, made of an insulating material differing from silicon oxide, on the silicon oxide film after the etching of the silicon oxide film to form a laminated film of a lower film, made of the silicon oxide film, and the upper film (Aspect 14).

Also, the step of forming the gate insulating film may include a step of forming the silicon oxide film to a thickness of 20 Å to 100 Å and a step of forming an upper film, made of an insulating material differing from silicon oxide, on the silicon oxide film while maintaining the thickness of the silicon film to form, as the gate insulating film, a laminated film of a lower film, made of the silicon oxide film, and the upper film (Aspect 15).

With this method, the absolute amount of the positive mobile ions in the silicon oxide film can be decreased by making the silicon oxide film 20 Å to 100 Å in thickness, and the area density $Q_M$ of positive mobile ions contained in the entire gate insulating film, made of the lower film (silicon oxide film) and the upper film together, can be made no more than $1 \times 10^{12}$ cm$^{-2}$.

BRIEF DESCRIPTION OF THE DRAWINGS

FIG. 6 is a sectional view of a semiconductor device according to a second preferred embodiment of the present invention.

MODES FOR CARRYING OUT THE INVENTION

Preferred embodiments of the present invention shall now be described in detail with reference to the attached drawings.

Figure 1:
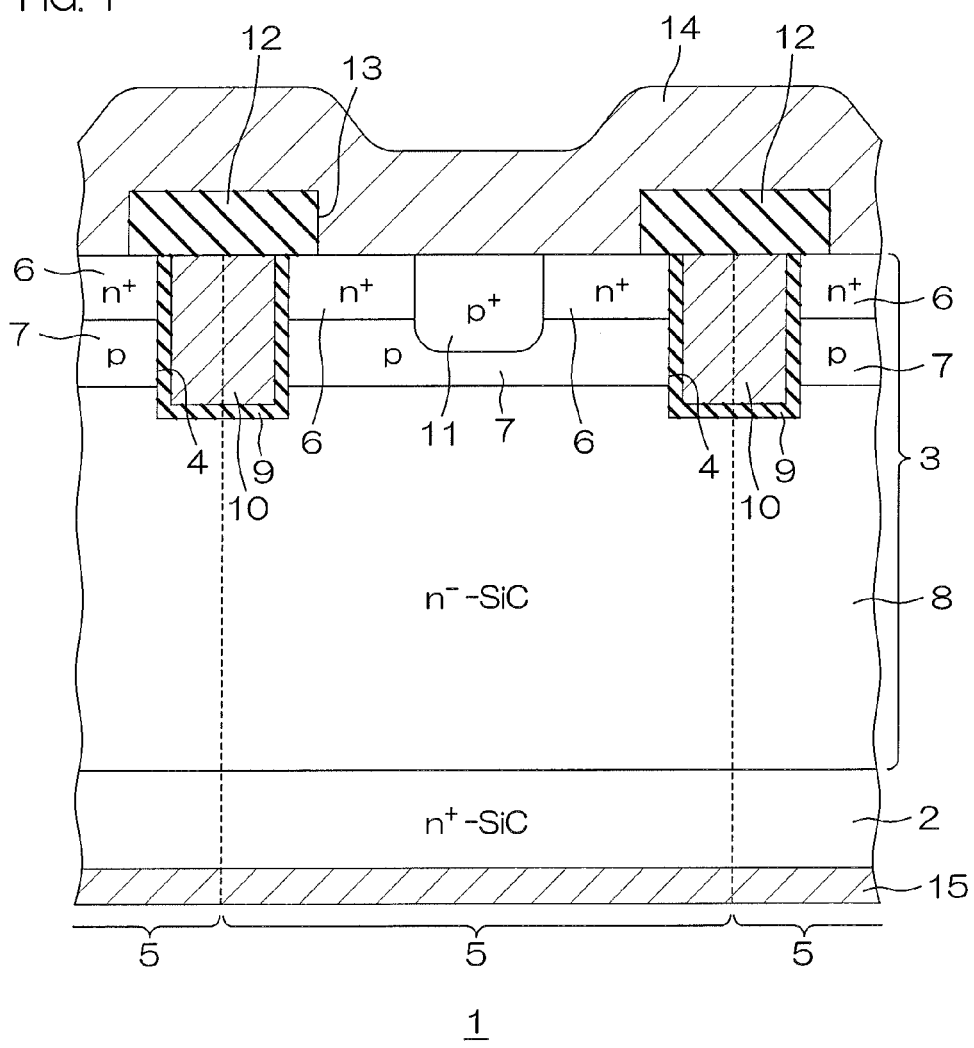
FIG. 1 is a sectional view of a semiconductor device according to a first preferred embodiment of the present invention.
Figure 2:
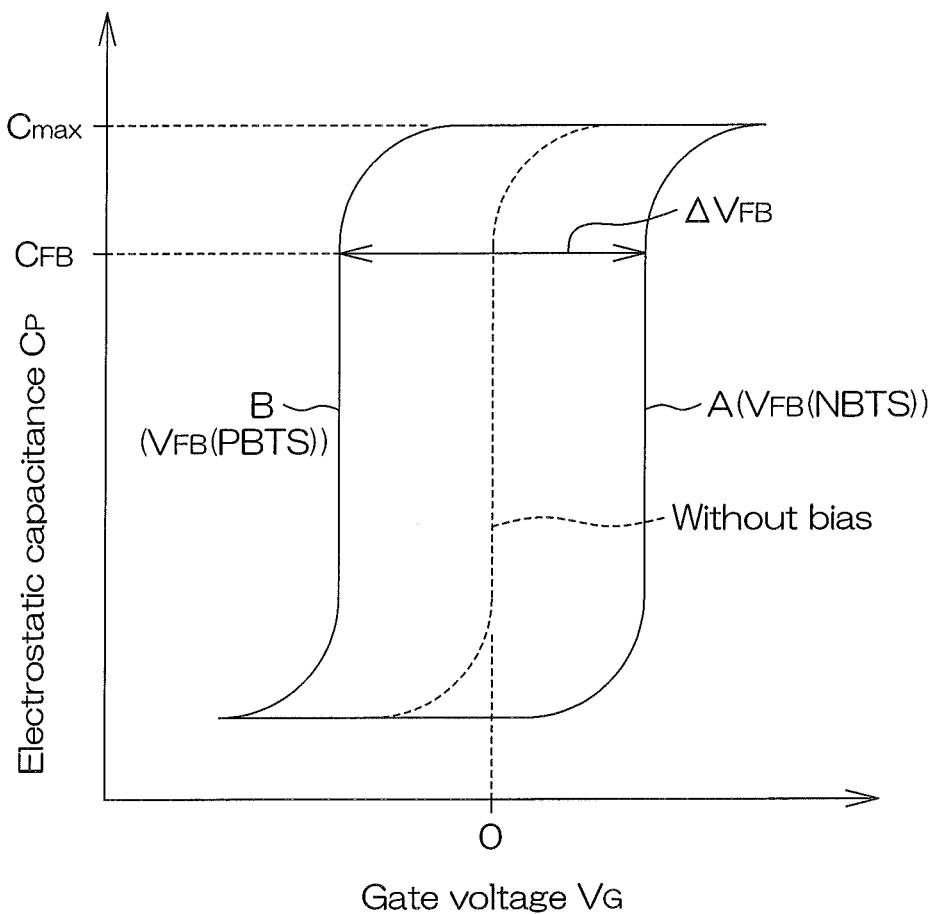
FIG. 2 shows C-V curves obtained by performing bias temperature stress tests on the semiconductor device of FIG. 1.

FIG. 1 is a sectional view of a semiconductor device according to a first preferred embodiment of the present invention. FIG. 2 shows C-V curves obtained by performing bias temperature stress tests on the semiconductor device of FIG. 1.

The semiconductor device 1 includes a SiC substrate 2 of an n$^+$ type (for example, a concentration of $1 \times 10^{19}$ to $5 \times 10^{19}$ cm$^{-3}$) and an SiC epitaxial layer 3 of an n$^-$ type (for example, a concentration of $1 \times 10^{15}$ to $1 \times 10^{16}$ cm$^{-3}$) that is formed on the SiC substrate 2. The SiC substrate 2 and the SiC epitaxial layer 3 make up an example of a "semiconductor layer" of the present invention. The SiC substrate 2 and the SiC epitaxial layer 3 function as a drain of the semiconductor device 1. As the n type impurity, phosphorus (P) or arsenic (As), etc., is contained. The same applies hereinafter.

Gate trenches 4 are formed in the SiC epitaxial layer 3 by digging in toward the SiC substrate 2 from a front surface of the SiC epitaxial layer 3. The gate trenches 4 are formed in lattice form or stripe form. A plurality of unit cells 5, partitioned by the gate trenches 4, are thereby formed in the SiC epitaxial layer 3.

At peripheries of the gate trenches 4 in the SiC epitaxial layer 3, source regions 6 of an type and body regions 7 of a p type (for example, a concentration of $1 \times 10^{17}$ to $5 \times 10^{17}$ cm$^{-3}$)

are formed in that order from the side closer to the front surface of the SiC epitaxial layer 3. As the p type impurity, for example, boron (B) or aluminum (Al), etc., is contained in the body regions 7. The same applies hereinafter.

The source region 6 is formed on a front surface portion of each unit cell 5 so as to be exposed on the front surface of the SiC epitaxial layer 3 and so as to define an upper portion (a portion) of a side surface of each gate trench 4. On the other hand, the body region 7 is formed so as to contact the source region 6 at the SiC substrate 2 side (SiC epitaxial layer 3 rear surface side) with respect to the source region 6 and so as to define a lower portion (a portion) of the side surface of each gate trench 4.

A region of the SiC epitaxial layer 3 at the SiC substrate 2 side with respect to the body region 7 is an n⁻ type drain region 8 that is maintained as it is in a state after epitaxial growth. The drain region 8 contacts the body region 7 at the SiC substrate 2 side with respect to the body region 7 and defines a bottom surface of the gate trench 4.

On an inner surface of the gate trench 4, a gate insulating film 9 is formed so as to cover the entire inner surface. A gate electrode 10 is embedded inside the gate trench 4 by embedding an impurity-doped polysilicon in the gate trench 4 at the inner side of the gate insulating film 9. A trench gate type MIS structure is thereby arranged in which the source region 6, the body region 7, and the drain region 8 that define the inner surface of the gate trench 4 face the gate electrode 10 across the gate insulating electrode 9.

In the present preferred embodiment, the gate insulating film 9 is made of a single layer film of silicon oxide ($SiO_2$) and has a thickness, for example, of 100 Å to 1000 Å (for example, 240 Å). The gate insulating film 9 contains positive mobile ions in its interior. The positive mobile ions are ions of positive charge that can move independently inside the gate insulating film 9 (silicon oxide film). In the present preferred embodiment, an area density $Q_M$ of positive mobile ions in the gate insulating film 9 is no more than $1 \times 10^{12}$ cm$^{-2}$ (for example, $1 \times 10^{11}$ cm$^{-2}$).

The area density $Q_M$ of positive mobile ions may, for example, be calculated by multiplying a maximum capacitance $C_{max}$ in C-V curves, obtained by performing bias temperature stress tests on the MIS structure made of the gate electrode 10, gate insulating film 9, and the SiC epitaxial layer 3, by a flat band voltage shift $\Delta V_{FB}$ ($C_{max} \times \Delta V_{FB}$). The C-V curves may be indicated as in FIG. 2.

In regard to the two curves A and B of FIG. 2, the curve A is a C-V curve obtained by a negative bias temperature stress (NBTS), and the curve B is a C-V curve obtained by a positive bias temperature stress (PBTS).

More specifically, of a C-V curve (specifically a hysteresis loop) obtained when the NBTS is applied under a condition of 200° C. and a C-V curve obtained when the semiconductor device 1 is returned to room temperature after applying the NBTS, the curve A is the latter C-V curve (for room temperature). Similarly, of a C-V curve (specifically a hysteresis loop) obtained when the PBTS is applied under the condition of 200° C. and a C-V curve obtained when the semiconductor device 1 is returned to room temperature after applying the PBTS, the curve B is the latter C-V curve (for room temperature). Also, of a C-V curve (specifically a hysteresis loop) obtained when a temperature stress test without application of a voltage V to the gate electrode 10 (without bias) is performed under a condition of 200° C. and a C-V curve obtained when the semiconductor device 1 is returned to room temperature after performing the temperature stress test, the broken-line curve sandwiched by the curve A and the curve B in FIG. 2 expresses the latter C-V curve (for room temperature).

In each stress test, the drain region 8 of the semiconductor device 1 and the source region 6 are made equipotential or open under a predetermined temperature condition (with the present preferred embodiment, room temperature or 200° C.) and the capacitance value across the gate and the source is measured in a state where a voltage V is applied to the gate electrode 10.

In FIG. 2, the maximum capacitance $C_{max}$ is the maximum capacitance value of the curves A and B and can also be calculated based on the structure of the semiconductor device 1. Specifically, when $\in$ is a dielectric constant of the gate insulating film 9, $S_G$ is an area of the gate insulating film 9 (the area of the inner surface of the gate trench 4), and $d_G$ is a thickness of the gate insulating film 9, $C_{max} = \in \cdot S_G / d_G$.

A flat band capacitance $C_{FB}$ can also be calculated based on the structure of the semiconductor device 1. In general, the flat band capacitance $C_{FB}$ can be expressed as $C_{FB} = C_{FBS} C_{OX} / (C_{FBS} + C_{OX})$, that is, as a serial capacitance of a capacitance $C_{OX}$ ($= \in_{OX} \in_0 / d_{OX}$) of an oxide film and a capacitance component $C_{FBS}$ ($= \in_S \in_0 / \lambda_D$) having a thickness approximately equal to the Debye length ($\lambda_D$) at a semiconductor interface. In the above formula, $\in_{OX}$ is a dielectric constant of the oxide film, $d_{OX}$ is a thickness of the oxide film, and $\in_S$ is a dielectric constant of the semiconductor.

$\Delta V_{FB}$ is the absolute value of the difference between a flat band voltage $V_{FB}$ (NBTS) of the curve A and a flat band voltage $V_{FB}$ (PBTS) of the curve B at the flat band capacitance $C_{FB}$ ($\Delta V_{FB} = |V_{FB}$ (NBTS) $- V_{FB}$ (PBTS)$|$).

The area density $Q_M$ of positive mobile ions can thus be expressed as: $Q_M = (\in \cdot S_G / d_G) \times |V_{FB}$ (NBTS) $- V_{FB}$ (PBTS)$|$.

With the present preferred embodiment, the flat band voltage shift $\Delta V_{FB}$ of the C-V curves at room temperature after performing the bias temperature stress tests on the MIS structure made of the gate electrode 10, the gate insulating film 9, and the SiC epitaxial layer 3 is, for example, no more than 10V when the film thickness of the gate insulating film 9 is no more than 50 nm (500 Å). Also, an electric field intensity $E_G$ due to the positive mobile ions in the gate insulating film 9 can be made no more than 5 MV/cm and preferably made equal to 2 MV/cm.

By the above, the area density $Q_M$ of positive mobile ions in the gate insulating film 9 is no more than $1 \times 10^{12}$ cm$^{-2}$ and therefore the hysteresis of the MIS structure when put into operation at a high temperature can be suppressed to be small. Consequently, high-temperature operation of the semiconductor device 1 can be stabilized. In particular, a device, such as an SiC semiconductor device, that is used as a high-voltage power device is often used in a state of high temperature due to self-heating, etc., and the effect due to the area density $Q_M$ of positive mobile ions being no more than $1 \times 10^{12}$ cm$^{-2}$ is thus extremely large.

A body contact region 11 of a type (for example, a concentration of $1 \times 10^{19}$ to $1 \times 10^{20}$ cm$^{-3}$) that penetrates through the source region 6 from the front surface of the SiC epitaxial layer 3 and has a deepest portion that reaches the body region 7 is formed in each unit cell 5.

An interlayer insulating film 12 is formed on the SiC epitaxial layer 3. A contact hole 13 exposing the body contact region 11 and the source region 6 (portion) is formed in the interlayer insulating film 12.

A source electrode 14 is formed on the interlayer insulating film 12. The source electrode 14 contacts all unit cells 5 (source regions 6 and channel connector regions 20) together via the respective contact holes 13. That is, the source electrode 14 is a wiring in common to all unit cells 5.

Also, a drain electrode 15 is formed on the rear surface of the SiC substrate 2 so as to cover the entire rear surface. The drain electrode 15 is an electrode in common to all unit cells 5.

Figure 3:
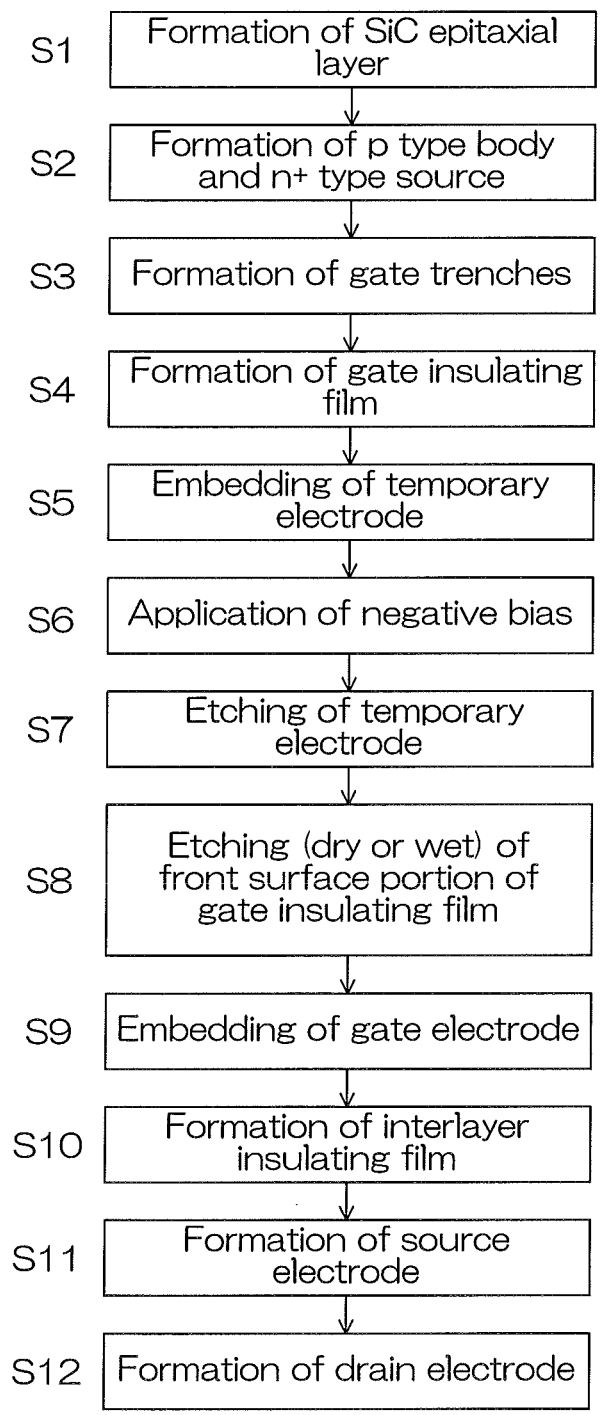
FIG. 3 is a flowchart for describing an example of a manufacturing process of the semiconductor device of FIG. 1.

FIG. 3 is a flowchart for describing an example of a manufacturing process of the semiconductor device of FIG. 1.

An Si crystal is grown while doping with an n type impurity on the SiC substrate 2 by an epitaxial growth method such as a CVD (chemical vapor deposition) method, LPE (liquid phase epitaxy) method, or MBE (molecular beam epitaxy) method, etc. The n⁻ type SiC epitaxial layer 3 (drain region 8) is thereby formed on the SiC substrate 2 (step S1).

Thereafter, a p type impurity and an n type impurity are implanted successively in the front surface of the SiC epitaxial layer 3. After implantation, annealing (for example at 1500° C. to 1800° C. for 3 minutes to 30 minutes) is performed to activate the respective implanted impurities and thereby form the body region 7 and the source region 6 at the same time (step S2).

Thereafter, the SiC epitaxial layer 3 is etched selectively. The SiC epitaxial layer 3 is thereby dry etched from the front surface to form the gate trenches 4 (step S3). At the same time, the plurality of unit cells 5 are formed in the SiC epitaxial layer 3.

Thereafter, the gate insulating film 9 (silicon oxide film) is formed on the inner surface of each gate trench 4 and the front surface of the SiC epitaxial layer 3, for example, by a thermal oxidation method (for example, 1100° C. to 1300° C.) (step S4).

Figure 4A:
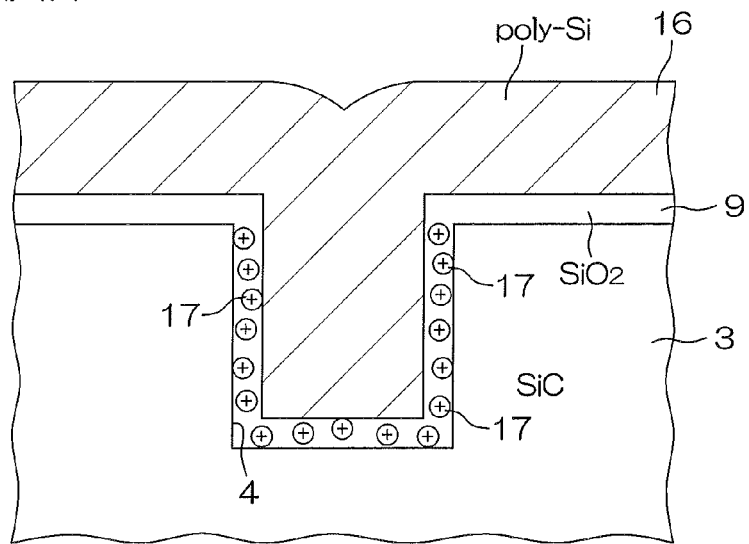
FIG. 4A is a sectional view for describing a process related to attraction of positive mobile ions and shows a state before the attraction of the positive mobile ions.

Thereafter, as shown in FIG. 4A, doped polysilicon (electrode material) is deposited from above the SiC epitaxial layer 3, for example, by the CVD method. The deposition of polysilicon is continued at least until the gate insulating film 9 is hidden. A temporary electrode 16 that is embedded in the inner side of the gate insulating film 9 in the gate trench 4 is thereby formed (step S5). At this point, positive mobile ions 17, which were generated in the interior of the gate insulating film 9 during the thermal oxidation of the SiC epitaxial layer 3, are distributed irregularly in the gate insulating film 9.

Figure 4B:
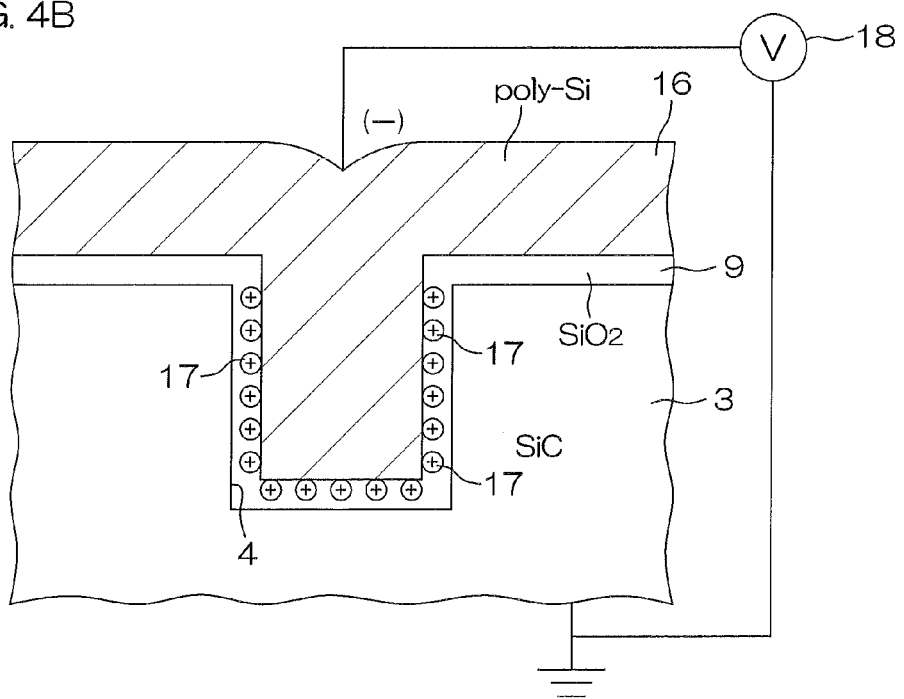
FIG. 4B is a sectional view for describing a process related to attraction of positive mobile ions and shows a state after the attraction of the positive mobile ions.

Thereafter, as shown in FIG. 4B, a negative power supply 18 is connected between the temporary electrode 16 and the SiC epitaxial layer 3 and a negative bias (for example, −5V to −20V) is applied to the temporary electrode 16 (step S6). The irregularly distributed positive mobile ions 17 are thereby attracted uniformly to a front surface portion (portion in contact with the temporary electrode 16) of the gate insulating film 9. The positive mobile ions 17 are positively charged.

Figure 5A:
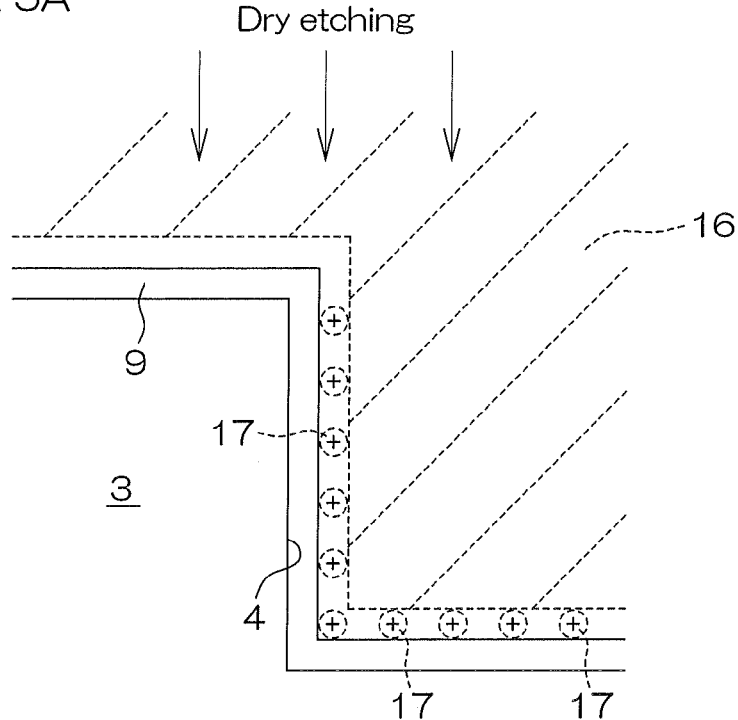
FIG. 5A is a sectional view for describing a process related to etching of a gate insulating film (silicon oxide film).

Thereafter, as shown in FIG. 5A, the temporary electrode 16 is etched by dry etching and the temporary electrode 16 is thereby removed completely (step S7). For example, $SF_6$ or $CF_4$, etc., is used as an etching gas. By making use of the dry etching, the front surface portion (portion at which the positive mobile ions 17 are gathered) of the gate insulating film 9 is eliminated and the gate insulating film 9 is made thin (step S8). The positive mobile ions 17 in the gate insulating film 9 can be removed sufficiently, for example, by eliminating 10 Å to 20 Å of the gate insulating film 9 with a thickness of 100 Å to 1000 Å. By thus making use of the dry etching for removing the temporary electrode 16, the front surface portion of the gate insulating film 9 can be eliminated continuously in succession to the removal of the temporary electrode 16 and the manufacturing process can thus be simplified.

Figure 5B:
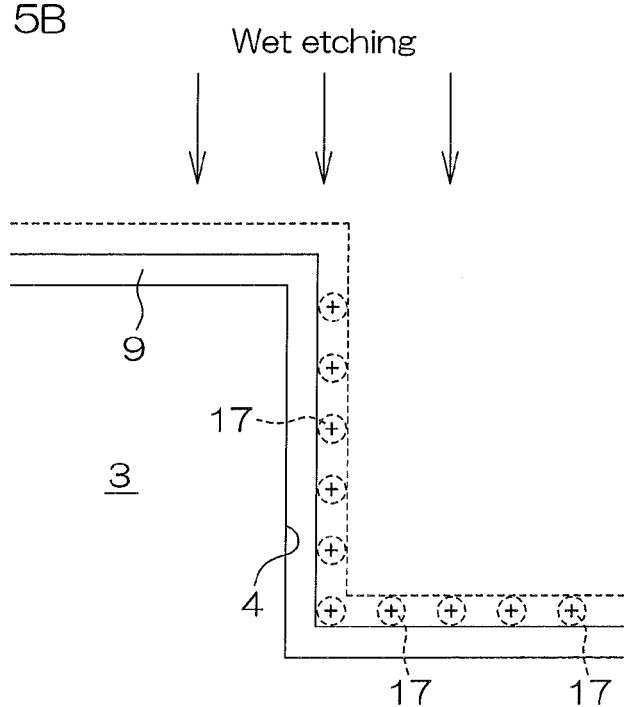
FIG. 5B is a sectional view for describing a process related to the etching of the gate insulating film (silicon oxide film).

Thereafter, the front surface portion of the gate insulating film 9 may be etched further by wet etching as shown in FIG. 5B. By making combined use of dry etching and wet etching to eliminate the front surface portion of the gate insulating film 9, the portion of the gate insulating film 9 in which the positive mobile ions 17 are gathered can be removed reliably, and the state of the front surface of the gate insulating film 9 that has been damaged by the dry etching can be improved by the wet etching. The dry etching may be stopped at the point at which the temporary electrode 16 is removed and the front surface portion of the gate insulating film 9 may be etched by just the wet etching.

By the thinning of the gate insulating film 9 as shown in FIG. 5A and FIG. 5B, the absolute amount of the positive mobile ions 17 in the gate insulating film 9 can be decreased and the area density $Q_M$ of the positive mobile ions 17 contained in the entire gate insulating film 9 can be made no more than $1\times10^{12}$ cm$^{-2}$.

After the attraction of the positive mobile ions 17 by the application of the negative bias to the temporary electrode 16, the process up to the etching of the front surface portion of the gate insulating film 9 (thinning of the gate insulating film 9) is preferably performed at room temperature. If the gate insulating film 9 is exposed to a high-temperature environment, the positive mobile ions 17 that are regularly distributed along the front surface portion of the gate insulating film 9 may diffuse into the gate insulating film 9 and become irregularly distributed again due to the heat energy. Occurrence of such a problem can thus be prevented by keeping the ambient temperature of the gate insulating film 9 at room temperature.

Thereafter, doped polysilicon (electrode material) is deposited from above the SiC epitaxial layer 3, for example, by the CVD method. The deposition of polysilicon is continued at least until the gate insulating film 9 is hidden. Thereafter, the deposited polysilicon is etched back until the etched-back surface is flush with respect to the front surface of the SiC epitaxial layer 3. The gate electrode 10, made of the polysilicon remaining inside the gate trench 4, is thereby formed (step S10). The gate electrode 10 is formed directly on the gate insulating film 9 after etching, and therefore the gate insulating film 9 of the semiconductor device 1 is formed as a single layer film of the silicon oxide film.

After the interlayer insulating film 12 is thereafter formed on the SiC epitaxial layer 3 (step S10) and the source electrode 14 is formed thereon (step S11), the drain electrode 15 is formed on the rear surface of the SiC substrate 2 (step S12). The semiconductor device 1 with the structure shown in FIG. 1 is thereby obtained.

FIG. 6 is a sectional view of a semiconductor device 21 according to a second preferred embodiment of the present invention. In FIG. 6, portions corresponding to respective portions shown in FIG. 1 in the description above are provided with the same reference symbols.

With the first preferred embodiment described above, the MIS structure is arranged as a trench gate type with which the gate electrode 10 faces the source region 6, the body region 7, and the drain region 8, which define the inner surface of the gate trench 4, across the gate insulating film 9.

On the other hand, the MIS structure of the semiconductor device 21 according to the second preferred embodiment is arranged as a planar gate type.

The planar gate type MIS structure includes a p type body region 22 formed selectively in a front surface portion of the SiC epitaxial layer 3, an n⁺ type source region 23 formed selectively in the body region 22, a gate insulating film 24 formed on the front surface of the SiC epitaxial layer 3, a gate electrode 25 facing the body region 22, exposed on the front surface of the SiC epitaxial layer 3, across the gate insulating film 24, and a p−' type body contact region 26 penetrating through the source region 6 from the front surface of the SiC epitaxial layer 3 and having a deepest portion that reaches the body region 7.

As with the gate insulating film 9 of the first preferred embodiment, the area density $Q_M$ of positive mobile ions contained in the interior of the gate insulating film 24 of the present semiconductor device 21 is also no more than $1 \times 10^{12}$ cm$^{-2}$.

Figure 7:
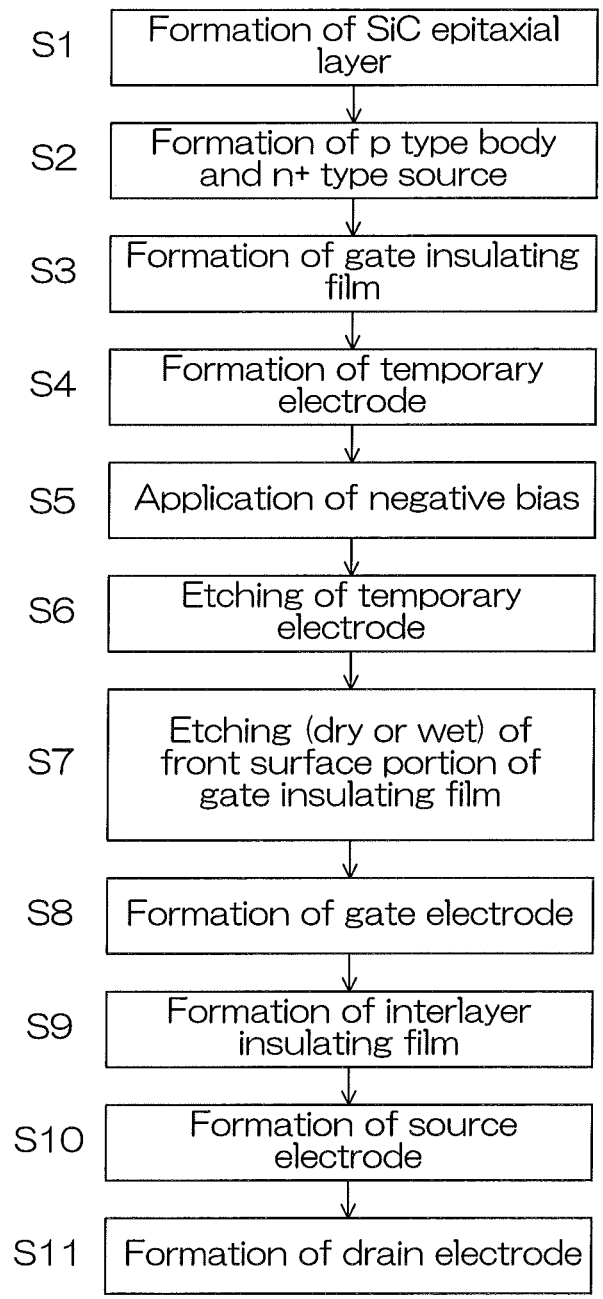
FIG. 7 is a flowchart for describing an example of a manufacturing process of the semiconductor device of FIG. 6.

As shown in FIG. 7, a manufacturing process of the semiconductor device 21 according to the present preferred embodiment is practically the same as the process shown in FIG. 3. However, due to the planar gate type MIS structure, the process of step S3 shown in FIG. 3 (process of forming the gate trench) is omitted.

Although preferred embodiments of the present invention have been described above, the present invention may be implemented in yet other modes.

Figure 8:
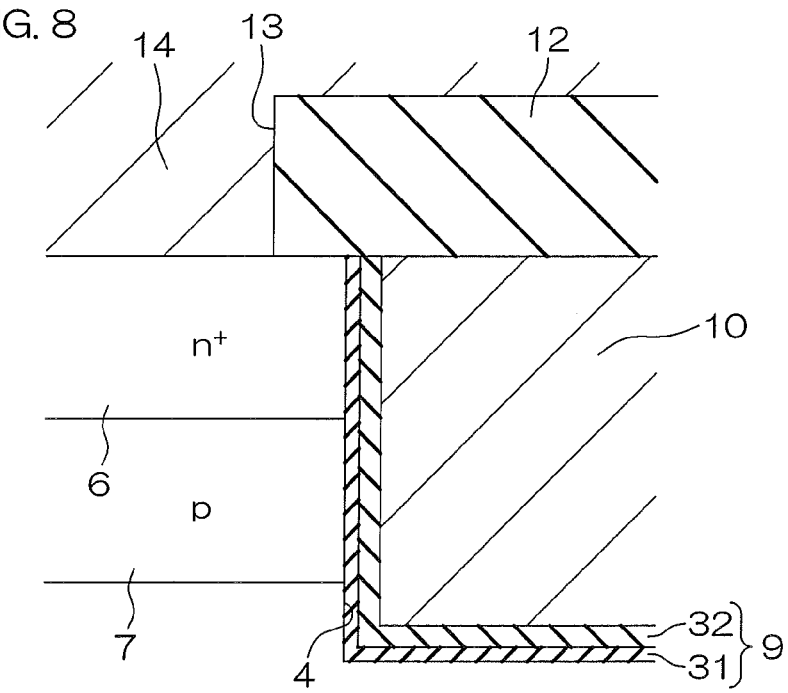
FIG. 8 is a sectional view for describing a modification example of the gate insulating film of FIG. 1.
Figure 9:
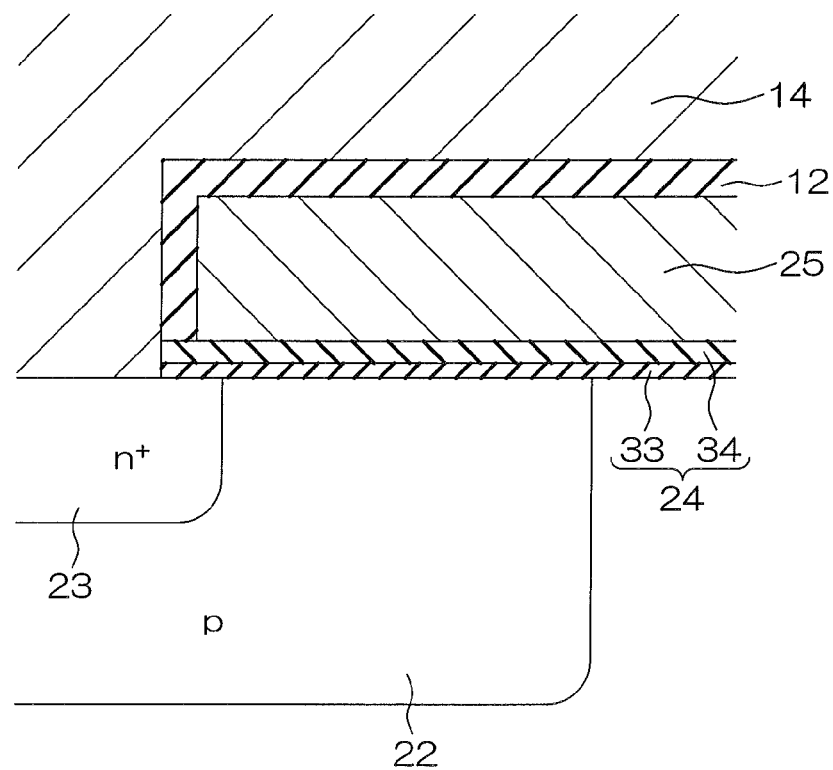
FIG. 9 is a sectional view for describing a modification example of the gate insulating film of FIG. 6.

For example, in each of the semiconductor devices 1 and 21, the gate insulating film 9 or 24 is not required to be a single layer film of silicon oxide film and may instead be a laminated film that includes, for example, a lower film 31 or 33 made of a silicon oxide film and an upper film 32 or 34 made of an insulating material differing from silicon oxide as shown in FIG. 8 (gate insulating film 9) or FIG. 9 (gate insulating film 24). In each of these cases, the lower film 31 or 33 is preferably thinner relative to the upper film 32 or 34. As examples of specific film thicknesses of these two films, the film thickness of the lower film 31 or 33 is 20 Å to 200 Å and that of the upper film 32 or 34 is 200 Å to 1000 Å.

Also, the material of the upper film 32 or 34 is, for example, preferably at least one type of material selected from the group consisting of aluminum oxide ($Al_2O_3$), aluminum oxynitride ($AlO_xN_y$), and hafnium oxide ($Hf_xO_y$). That is, the gate insulating film 9 or 24 may be a film with which a high-dielectric-constant film (high-k film) is laminated as the upper film 32 or 34 on the silicon oxide film (lower film 31 or 33). The upper film 32 or 34 may be a single layer film of the high-dielectric-constant film or may be a laminated film.

A manufacturing process of the semiconductor device 1 or 21 having such a laminated film is practically the same as the process shown in FIG. 3 or FIG. 7. However, the upper film 32 or 34 is formed on the gate insulating film 9 or 24 after etching (step S8 of FIG. 3 or step S7 of FIG. 7) as the lower film 31 or 33.

On the other hand, even if steps S5 to S8 of FIG. 3 or steps S4 to S7 of FIG. 7 are not performed, if the lower film 31 or 33 is a thin film of 20 Å to 100 Å, it can be formed by reducing the thermal oxidation treatment time of the SiC epitaxial layer 3. With this method, the lower film 31 or 33 (silicon oxide film) itself is thin and therefore the absolute amount of positive mobile ions in the film can be decreased. Consequently, the area density $Q_M$ of positive mobile ions contained in the entire gate insulating film 9 or 24, made of the lower film 31 or 33 and the upper film 32 or 34 together, can be made no more than $1 \times 10^{12}$ cm$^{-2}$.

Also in each of the semiconductor devices 1 and 21, an arrangement with which the conductivity types of the respective semiconductor portions are inverted may be adopted. For example, in the semiconductor device 1, a p type portion may be of an n type and an n type portion may be of a p type.

Also, although with each of the preferred embodiments, an arrangement with which the gate insulating film 9 is formed and etched uniformly was described, the present invention is not restricted to such an arrangement. For example, at a terminal portion of a gate trench at which variation occurs readily or at a "gate finger" portion at which the formation of a channel is not required when a gate voltage is applied, the gate insulating film ($SiO_2$) that is formed by thermal oxidation may be left as it is and just the other portions may be thinned by etching.

Also, although with the preferred embodiments, DMISFETs of the trench gate type and the planar gate type were taken up as examples of the present invention, the present invention may also be applied to a MIS transistor structure, such as a CMOSFET (complementary metal oxide semiconductor field effect transistor), etc.

Besides the above, various design modifications may be made within the scope of the matters described in the claims.

Verification Examples

The following verification examples were carried out to confirm the effects of the present invention.

Figure 10A:
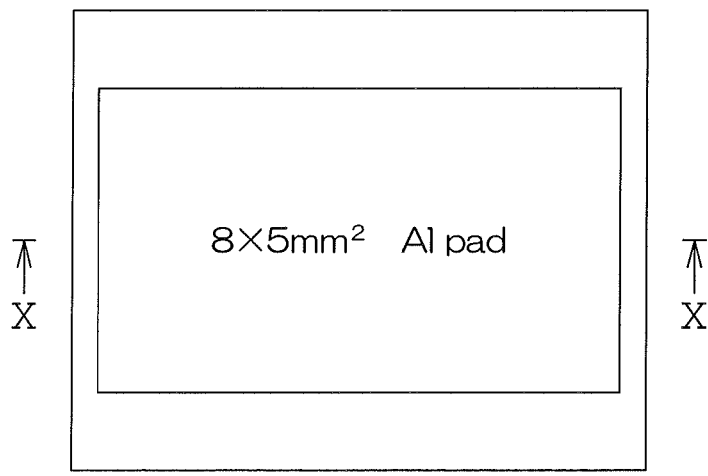
FIG. 10A is a plan view and FIG. 10B is a sectional view of a semiconductor device used in a verification example (EOT=40 nm).
Figure 10B:
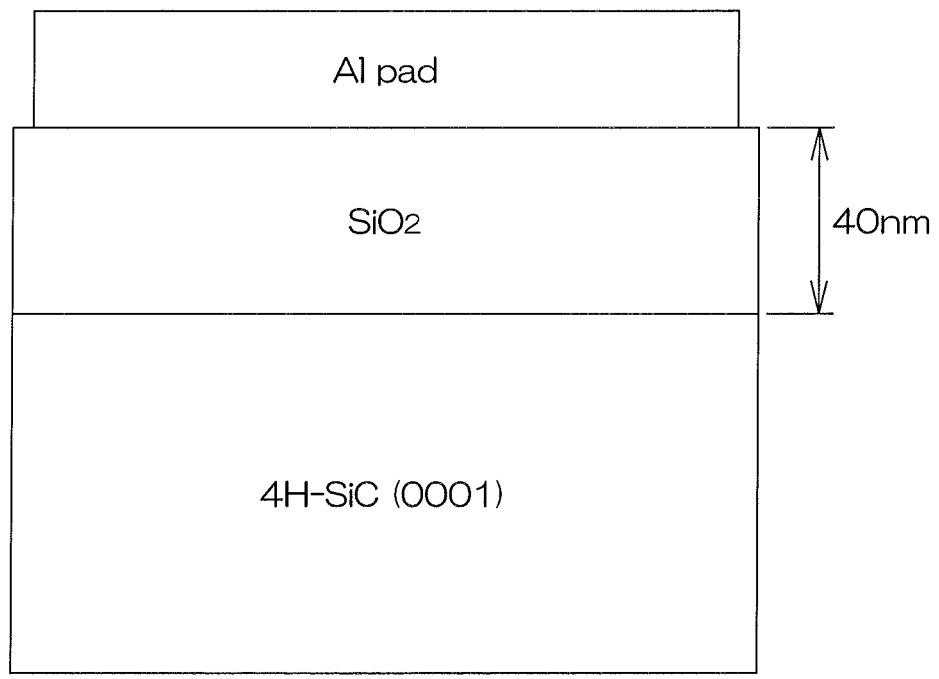

Specifically, first, the (0001) surface of an n type 4H-SiC substrate was thermally oxidized (dry-oxidized) to form a 40 nm silicon oxide ($SiO_2$) film. Thereafter, an aluminum (Al) film was deposited by a sputtering method and the aluminum film was patterned by photolithography. An aluminum pad having an area of $8 \times 5$ mm$^2$ was thereby formed to prepare an MIS structure (EOT (equivalent oxide thickness)) as shown in FIGS. 10A and 10B.

Figure 11:
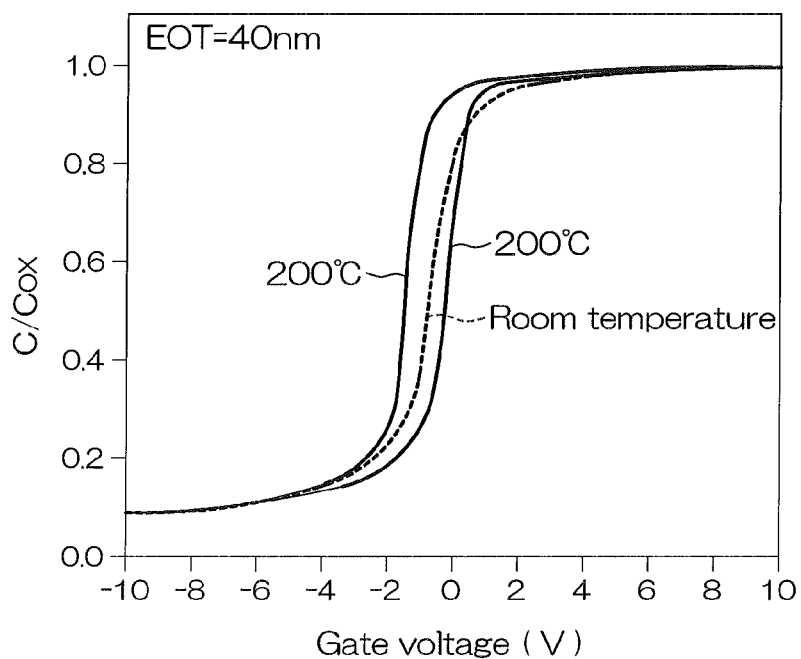
FIG. 11 shows C-V curves obtained when measurements are made at room temperature and at 200° C. on the semiconductor device used in the verification example (EOT=40 nm).

Thereafter, C-V curves at room temperature and 200° C. of the MIS structure shown in FIG. 10 were determined. The results are shown in FIG. 11.

Figure 12:
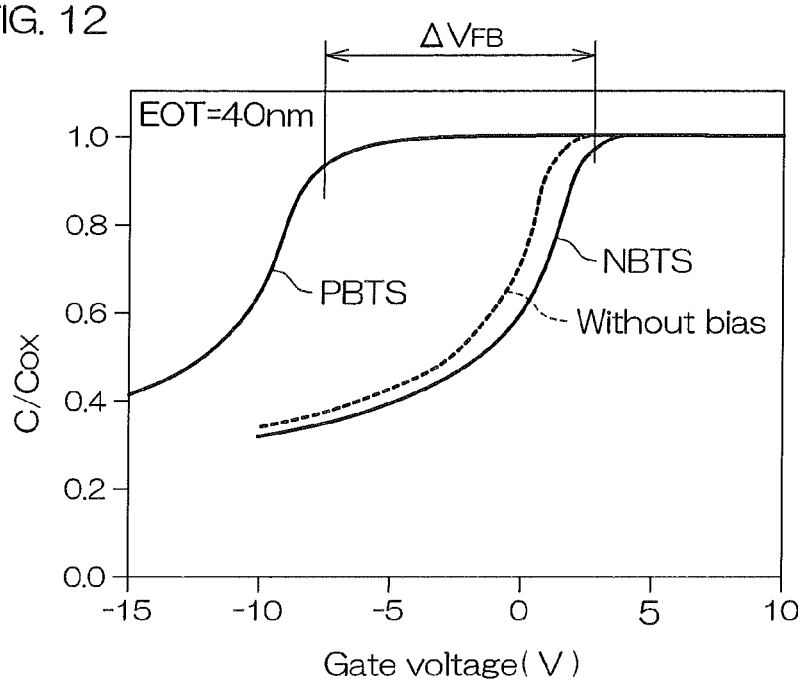
FIG. 12 shows C-V curves obtained when bias temperature stress tests are performed on the semiconductor device used in the verification example (EOT=40 nm).
Figure 13A:
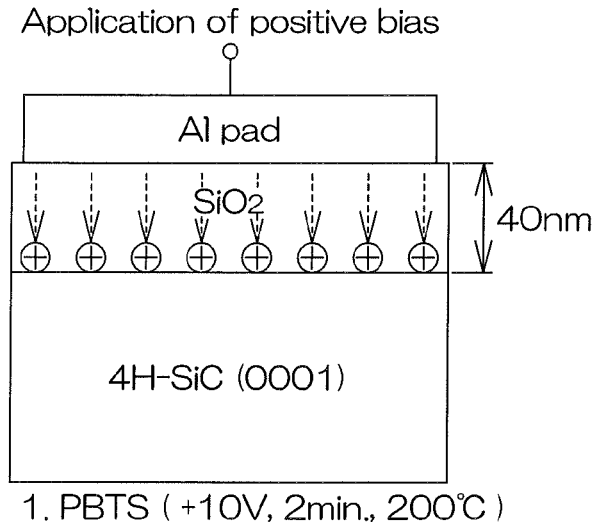
FIGS. 13A, 13B, and 13C are sectional views for describing a process related to a PBTS applied to the verification example.
Figure 14A:
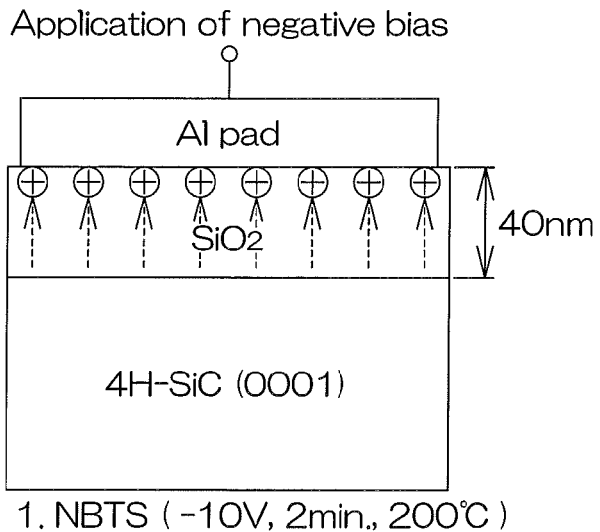
FIGS. 14A, 14B, and 14C are sectional views for describing a process related to an NBTS applied to the verification example.

Thereafter, as shown in FIG. 13A and FIG. 14A, a PBTS or an NBTS was applied by applying a positive bias (+10V, 2 min., 200° C.) or a negative bias (−10V, 2 min., 200° C.) to the aluminum pad. The MIS structure was thereafter returned to room temperature while keeping the bias applied. Capacitance values across the pad and SiC of the MIS structure after being returned to room temperature were then measured. The C-V curves obtained by these measurements are shown by solid lines in FIG. 12. On the other hand, after performing a temperature stress test without applying a voltage to the aluminum pad (without bias) under the condition of 200° C., the MIS structure was returned to room temperature. Capacitance values across the pad and SiC of the MIS structure after being returned to room temperature were then measured. The C-V curve obtained by these measurements is shown by a broken line in FIG. 12.

Figure 13B:
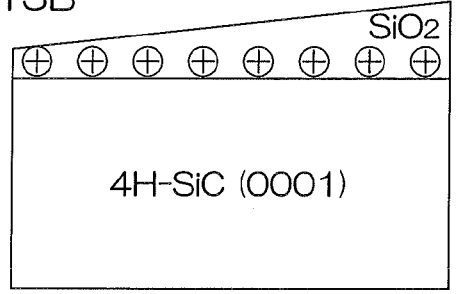
Figure 14B:
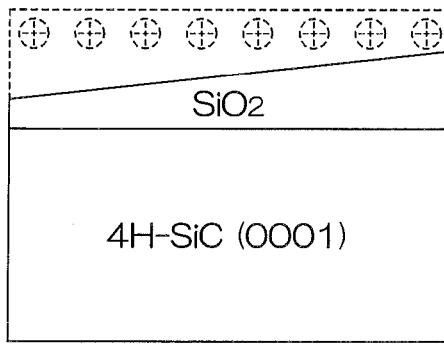

Thereafter, as shown in FIG. 13B and FIG. 14B, the aluminum pad of each MIS structure after the PBTS or NBTS was removed and the silicon oxide film was etched incliningly using HF. A silicon oxide film with which the film thickness (EOT) changes continuously along the (0001) surface of the 4H-SiC substrate was thereby obtained. Although unillustrated, the silicon oxide film was also etched incliningly in the same manner with the MIS structure after performing the temperature stress test (without bias).

Figure 13C:
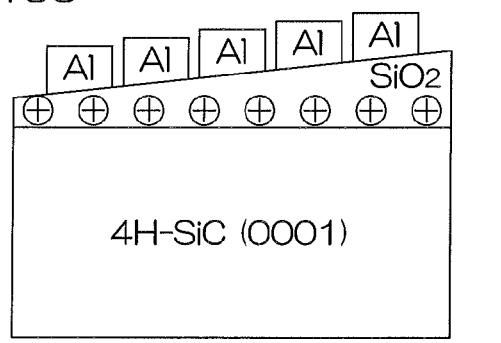
Figure 14C:
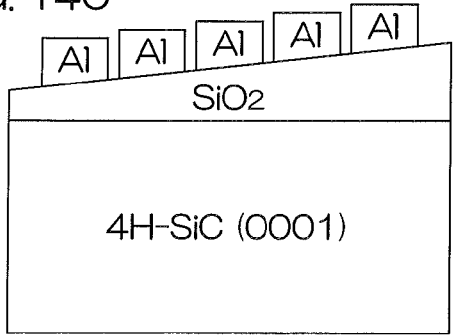
Figure 15:
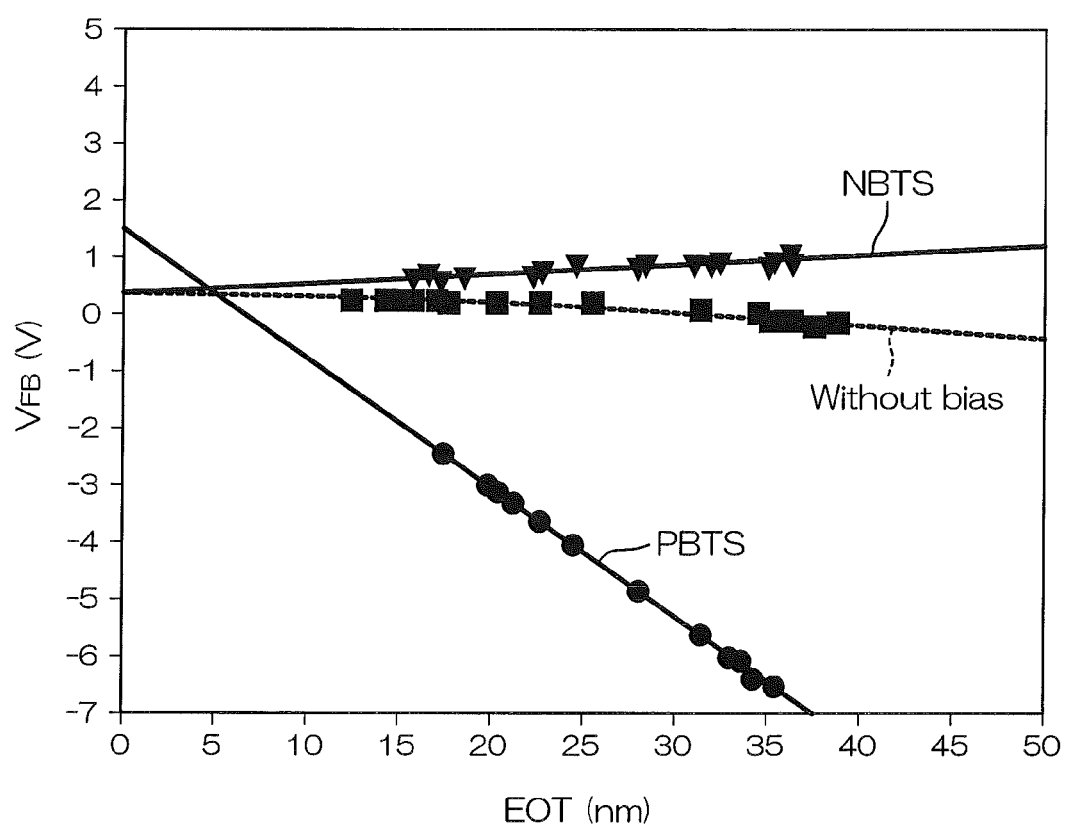
FIG. 15 is a graph for describing the charge distribution in a silicon oxide film after a bias temperature stress test.

As shown in FIG. 13C and FIG. 14C, a plurality of gate electrodes of 200 μm width were formed at equal intervals along the direction of inclination of an upper surface (inclined surface) of each silicon oxide film. Although unillustrated, a plurality of gate electrodes were also formed in the same manner with the MIS structure after performing the temperature stress test (without bias). With each MIS structure, the $V_{FB}$ at the position of formation of each gate electrode was determined. The results are shown in FIG. 15. FIG. 15 shows a relationship of the film thickness (EOT) and the $V_{FB}$ at the position of formation of each gate electrode.

As shown in FIG. 12, with the MIS structure of FIG. 10, for $\in$=3.9, $S_G$=8×5 mm$^2$, and $d_G$=40 nm, $\Delta V_{FB}$=10V. From this result, it was found that $Q_M$=3.7×10$^{12}$ cm$^{-2}$.

On the other hand, as shown in FIG. 15, it was found that with the MIS structure that was removed of the silicon oxide film after the NBTS, $Q_M$=−0.384×10$^{12}$ cm$^{-2}$. Specifically, based on the two formulae of $C=\in_{OX}\cdot(S/d_{OX})$ and $Q_M = C \cdot \Delta V_{FB}$, the relational expression expressing the graph of FIG. 15: $\Delta V_{FB} = Q_M \cdot (1/\epsilon_{OX} S) \cdot d_{OX}$ is derived. In reference to this relational expression, $Q_M$ is the slope of each graph in FIG. 15 and $Q_M$ can thus be determined based on the slope of each graph. Similarly, it was found that with the MIS structure that was removed of the silicon oxide film after the PBTS, $Q_M = +4.937 \times 10^{12}$ cm$^{-2}$ and with the MIS structure that was removed of the silicon oxide film after the test without bias, $Q_M = +0.468 \times 10^{12}$ cm$^{-2}$.

By the above, it was confirmed that, by the present invention, the area density $Q_M$ of positive mobile ions in the silicon oxide film can be made no more than $1 \times 10^{12}$ cm$^{-2}$ even during high-temperature use. It was also confirmed that $\Delta V_{FB} = 10V$ or less can be realized when the film thickness (EOT) of the gate insulating film is made no more than 50 nm (500 Å). Also, it was confirmed that the electric field intensity due to the positive mobile ions in the gate insulating film can be made no more than 5 MV/cm and preferably 2 MV/cm. These results were obtained by removing only several nm of the silicon oxide film (SiO$_2$) as shown in FIG. 15.

DESCRIPTION OF THE SYMBOLS

1 Semiconductor device
2 SiC substrate
3 SiC epitaxial layer
4 Gate trench
9 Gate insulating film
10 Gate electrode
16 Temporary electrode
17 Positive mobile ions
21 Semiconductor device
24 Gate insulating film
25 Gate electrode
31 Lower film
32 Upper film
33 Lower film
34 Upper film

What is claimed is:

1. A method for manufacturing a semiconductor device comprising:
    forming a gate insulating film, which includes a silicon oxide film formed by thermal oxidation of a semiconductor layer made of SiC and with which the area density $Q_M$ of positive mobile ions in its interior is no more than $1 \times 10^{12}$ cm$^{-2}$; and
    forming an MIS structure by forming a gate electrode on the gate insulating film,
    wherein the forming the gate insulating film comprises
    forming a temporary electrode on a front surface of the silicon oxide film,
    applying a negative bias to the temporary electrode to attract the positive mobile ions in the silicon oxide film toward a front surface portion of the silicon oxide film,
    removing the temporary electrode after attracting the positive mobile ions, and
    etching the front surface portion of the silicon oxide film after removing the temporary electrode.

2. The method for manufacturing a semiconductor device according to claim 1, wherein the removing the temporary electrode comprises dry etching the temporary electrode, and
    the etching the front surface portion of the silicon oxide film comprises dry etching the silicon oxide film by the dry etching for removing the temporary electrode.

3. The method for manufacturing a semiconductor device according to claim 1, wherein the etching the front surface portion of the silicon oxide film comprises wet etching the silicon oxide film.

4. The method for manufacturing a semiconductor device according to claim 1, wherein the forming the gate electrode comprises forming the gate electrode directly on the silicon oxide film after the etching of the silicon oxide film.

5. The method for manufacturing a semiconductor device according to claim 1, wherein the forming the gate insulating film comprises further forming an upper film, made of an insulating material different from silicon oxide, on the silicon oxide film after the etching of the silicon oxide film to form, as the gate insulating film, a laminated film of a lower film, made of the silicon oxide film, and the upper film.

6. The method for manufacturing a semiconductor device according to claim 1, wherein the forming the gate insulating film comprises forming the silicon oxide film to a thickness of 20 Å to 200 Å and
    further forming an upper film, made of an insulating material different from silicon oxide, on the silicon oxide film while maintaining the thickness of the silicon oxide film to form, as the gate insulating film, a laminated film of a lower film, made of the silicon oxide film, and the upper film.

* * * * *